United States Patent
Vicente et al.

(10) Patent No.: US 8,788,233 B2
(45) Date of Patent: Jul. 22, 2014

(54) DIAGNOSTIC SYSTEM AND METHOD FOR A THERMISTOR AMPLIFIER CIRCUIT

(75) Inventors: Nataniel Barbosa Vicente, Prospect, KY (US); Todd Elliott Greenwood, Pewee Valley, KY (US); Craig Benjamin Williams, Louisville, KY (US)

(73) Assignee: General Electric Company, Schenectady, NY (US)

( * ) Notice: Subject to any disclaimer, the term of this patent is extended or adjusted under 35 U.S.C. 154(b) by 352 days.

(21) Appl. No.: 13/008,571

(22) Filed: Jan. 18, 2011

(65) Prior Publication Data

US 2012/0185196 A1 Jul. 19, 2012

(51) Int. Cl.
*G06F 19/00* (2011.01)
(52) U.S. Cl.
USPC .................................................... 702/99
(58) Field of Classification Search
CPC ...................................................... G06F 19/00
USPC ........................................................... 702/99
See application file for complete search history.

(56) References Cited

U.S. PATENT DOCUMENTS

| | | | | |
|---|---|---|---|---|
| 3,675,484 A | * | 7/1972 | Pederson | 331/66 |
| 4,371,837 A | * | 2/1983 | Sieverin | 324/225 |
| 7,369,389 B2 | | 5/2008 | Vicente et al. | |
| 7,839,617 B2 | | 11/2010 | Vicente et al. | |

OTHER PUBLICATIONS

"Thermistor" from Wikipedia; Jan. 18, 2011; http://en.wikipedia.org/wiki/Thermistor; 6 pages.

* cited by examiner

*Primary Examiner* — Bryan Bui
(74) *Attorney, Agent, or Firm* — Cantor Colburn LLP

(57) ABSTRACT

A diagnostic system and a diagnostic method for a thermistor amplifier circuit are provided. The system includes a transistor electrically coupled to a controllable variable resistor having a predetermined resistance. The transistor applies a test voltage signal to the circuit indicative of a first temperature value. An amplitude of the test voltage value is indicative of a simulated thermistor temperature value. The microprocessor determines a test temperature value based on the amplitude of an output voltage of the circuit. The microprocessor also determines an inaccuracy value based on the test temperature value and the simulated thermistor temperature value.

20 Claims, 6 Drawing Sheets

FIG. 3

Lookup Table

| Resistance Value | Simulated Thermistor Temperature Value | |
|---|---|---|
| 0 Ω | 32° C | —310 |
| 5 Ω | 100° C | —312 |
| 10 Ω | 200° C | —314 |

DIAGNOSTIC SYSTEM AND METHOD FOR A THERMISTOR AMPLIFIER CIRCUIT

BACKGROUND OF THE INVENTION

The subject matter disclosed herein relates to a diagnostic system and a diagnostic method for a thermistor amplifier circuit.

BRIEF DESCRIPTION OF THE INVENTION

A diagnostic system for a thermistor amplifier circuit in accordance with an exemplary embodiment is provided. The diagnostic system includes a transistor being electrically coupled in series with a controllable variable resistor. The transistor has an input terminal, a first output terminal, and a second output terminal. The first output terminal is electrically coupled to the thermistor amplifier circuit. The controllable variable resistor is electrically coupled between the second output terminal and electrical ground. The controllable variable resistor is configured to have a first predetermined resistance in response to receiving a first control signal from a microprocessor. The transistor is configured to apply a first test voltage signal to the thermistor amplifier circuit in response to receiving a second control signal from the microprocessor. An amplitude of the first test voltage signal is indicative of a first simulated thermistor temperature value. The microprocessor is configured to determine an amplitude of a first output voltage of the thermistor amplifier circuit and to determine a first test temperature value based on the amplitude of the first output voltage. The microprocessor is further configured to determine a first inaccuracy value based on the first test temperature value and the first simulated thermistor temperature value.

A diagnostic method for a thermistor amplifier circuit utilizing a diagnostic system in accordance with another exemplary embodiment is provided. The diagnostic system has a transistor that is electrically coupled in series with a controllable variable resistor. The transistor has an input terminal, a first output terminal, and a second output terminal. The input terminal is electrically coupled to a microprocessor. The first output terminal is electrically coupled to the thermistor amplifier circuit. The controllable variable resistor is electrically coupled between the second output terminal and electrical ground. The diagnostic method includes setting a resistance of the controllable variable resistor to a first predetermined resistance in response to the controllable variable resistor receiving a first control signal from the microprocessor. The diagnostic method further includes applying a first test voltage signal to the thermistor amplifier circuit utilizing the transistor in response to the transistor receiving a second control signal from the microprocessor. An amplitude of the first test voltage signal is indicative of a first simulated thermistor temperature value. The diagnostic method further includes determining an amplitude of a first output voltage of the thermistor amplifier circuit utilizing the microprocessor. The diagnostic method further includes determining a first test temperature value based on the amplitude of the first output voltage utilizing the microprocessor. The diagnostic method further includes determining a first inaccuracy value based on the first test temperature value and the first simulated thermistor temperature value, utilizing the microprocessor. The diagnostic method further includes storing the first inaccuracy value in a memory device utilizing the microprocessor.

These and other advantages and features will become more apparent from the following description taken in conjunction with the drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

FIG. 3 is a schematic of a lookup table utilized in the diagnostic system of FIG. 1.

The detailed description explains embodiments of the invention, together with advantages and features, by way of example with reference to the drawings.

DETAILED DESCRIPTION OF THE INVENTION

Figure 1:
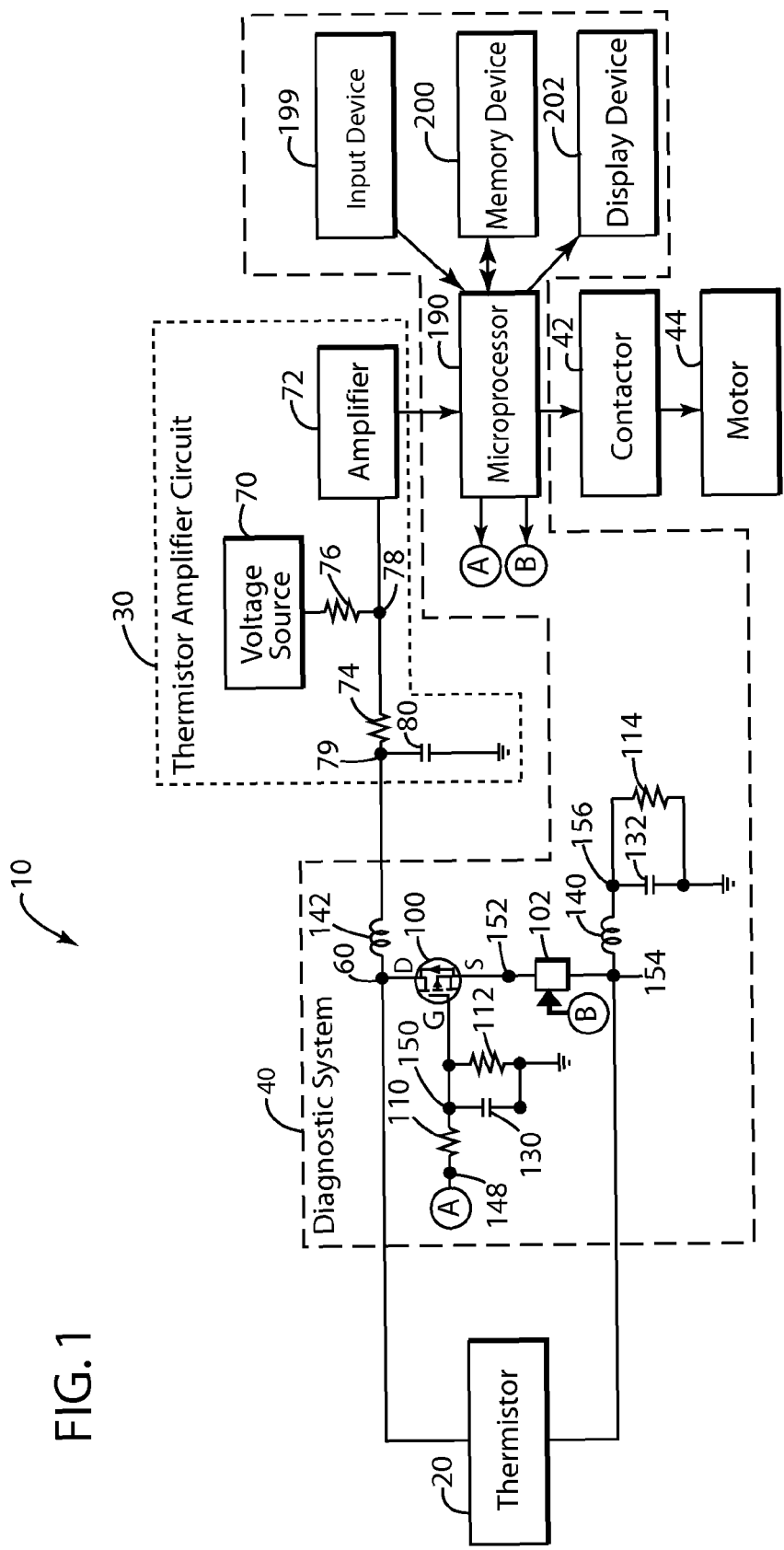
FIG. 1 is a schematic of a motor control system having a diagnostic system for a thermistor amplifier circuit in accordance with an exemplary embodiment.

Referring to FIG. 1, a motor control system 10 for controlling operation of a motor 44 is illustrated. The motor control system 10 has a diagnostic system 40 for a thermistor amplifier circuit 30 in accordance with an exemplary embodiment. The motor control system 10 includes a thermistor 20, the thermistor amplifier circuit 30, the diagnostic system 40, a contactor 42, and the motor 44.

The thermistor 20 is configured to generate a signal indicative of a temperature level of the motor 44. The thermistor 20 is disposed proximate to the motor 44 and is electrically coupled between nodes 60, 154 of the diagnostic system 40.

The thermistor amplifier circuit 30 is configured to amplify a voltage from the thermistor 20. The thermistor amplifier circuit 30 includes a voltage source 70, an amplifier 72, resistors 74, 76, nodes 78, 79, and a capacitor 80. The voltage source 70 is configured to supply an operational voltage to the thermistor amplifier circuit 30. As shown, a resistor 76 is electrically coupled between the voltage source 70 and the node 78. A resistor 74 is electrically coupled between nodes 76, 79, and the capacitor 80 is electrically coupled between the node 79 and electrical ground. The thermistor amplifier circuit 30 receives a signal from either the thermistor 20 or the diagnostic system 40 and amplifies an amplitude of the received signal and outputs an output voltage that is received by the microprocessor 190.

The diagnostic system 40 is configured to apply a test voltage signal to the thermistor amplifier circuit 30 wherein an amplitude of the test voltage signal is indicative of a simulated thermistor temperature value. The diagnostic system 40 is further configured determine an amplitude of an output voltage of the thermistor amplifier circuit 30 and to determine a test temperature value based on the amplitude of the output voltage. The diagnostic system 40 is further configured to determine an inaccuracy value based on the test temperature value and the simulated thermistor temperature value.

The diagnostic system 40 includes a transistor 100, a controllable resistor 102, resistors 110, 112, 114, capacitors 130, 132, inductors 140, 142, nodes 148, 150, 152, 154, 156, 160, the microprocessor 190, an input device 199, a memory device 200, and a display device 202.

The transistor 100 is electrically coupled in series with the controllable variable resistor 102. In one exemplary embodiment, the transistor 100 is a field-effect transistor. Of course, in alternative embodiments, other types of transistors known to those skilled in the art could be utilized such as a BJT transistor or an IGBT transistor for example. As shown, the transistor 100 has an input terminal (G) also referred to as a gate terminal, a first output terminal (D) also referred to as a drain terminal, and a second output terminal (S) also referred to as a source terminal. The input terminal (G) is coupled to a node 150. The resistor 112 is electrically coupled in parallel with the capacitor 130 between the node 150 and electrical ground; and a resistor 110 is electrically coupled in series between the node 150 and the microprocessor 190. Also, the first output terminal (D) is electrically coupled to the thermistor amplifier circuit 30 via the inductor 142 that is electrically coupled between the node 60 and the node 79.

The controllable variable resistor 152 is electrically coupled between the second output terminal (S) and electrical ground. In particular, the controllable variable resistor 152 is electrically coupled between the nodes 152, 154. The inductor 140 is electrically coupled between the nodes 154, 156; and the capacitor 132 and a resistor 114 are electrically coupled in parallel to one another between the node 156 and electrical ground. The controllable variable resistor 152 is configured to have a predetermined resistance in response to receiving a control signal from the microprocessor 190, and further configured to have another predetermined resistance in response to receiving another control signal from the microprocessor 190.

Figure 2:
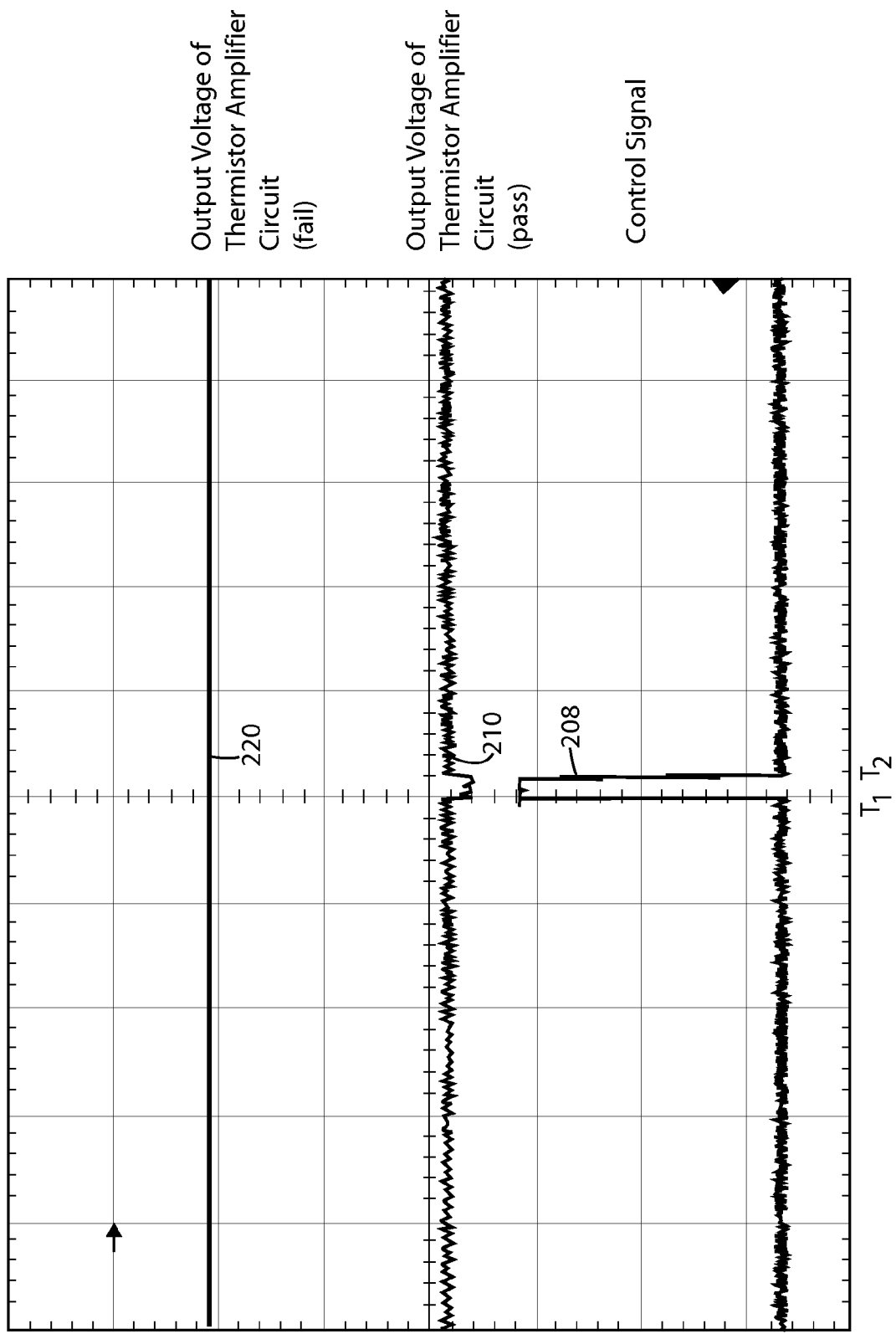
FIG. 2 is a graph of an exemplary control signal utilized in the diagnostic system of FIG. 1 and two exemplary output signals generated by a thermistor amplifier circuit in the motor control system of FIG. 1.
Figure 4:
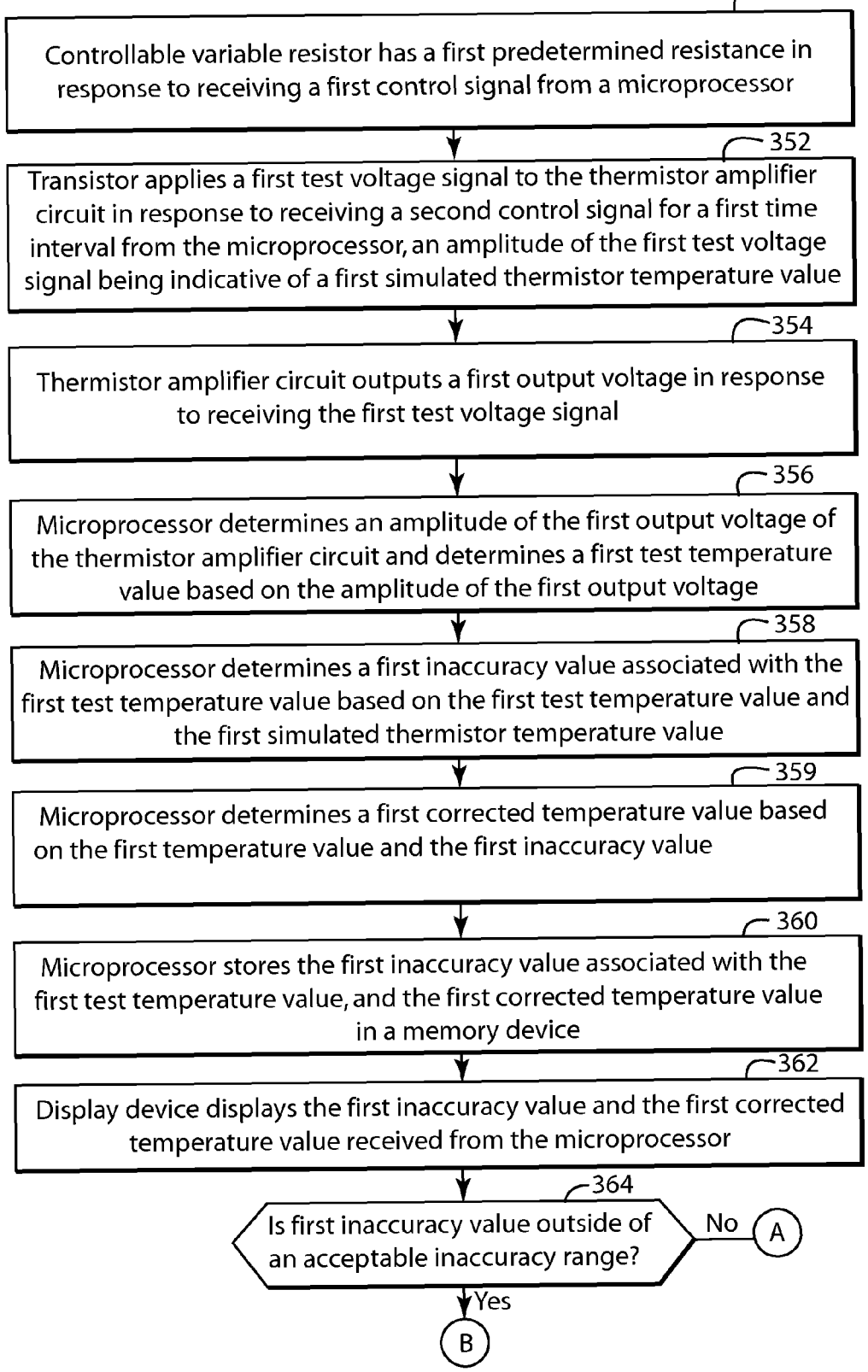
FIGS. 4-6 are flowchart diagrams for a diagnostic method for the thermistor amplifier circuit of FIG. 1 in accordance with another exemplary embodiment.
Figure 5:
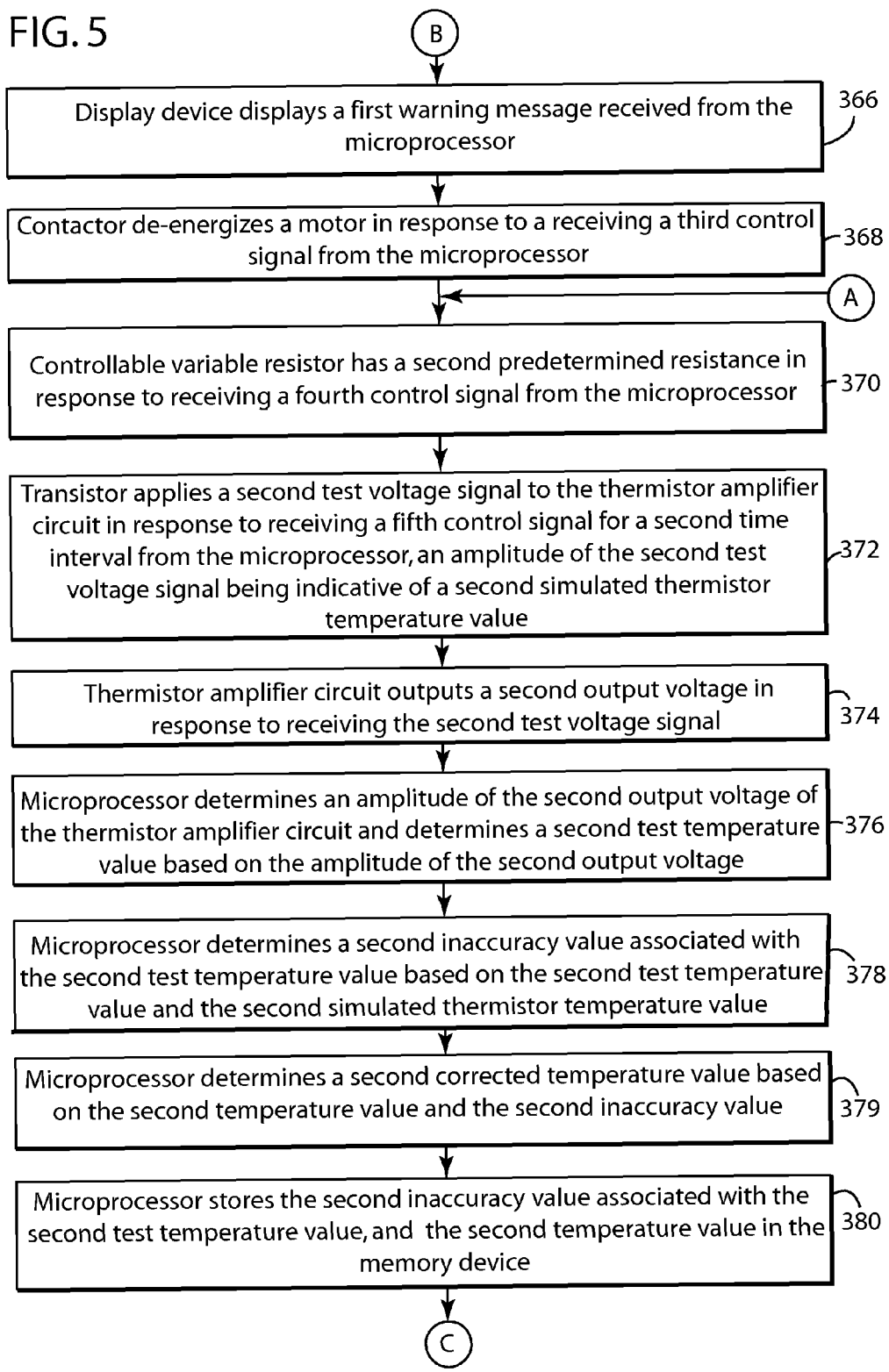
Figure 6:
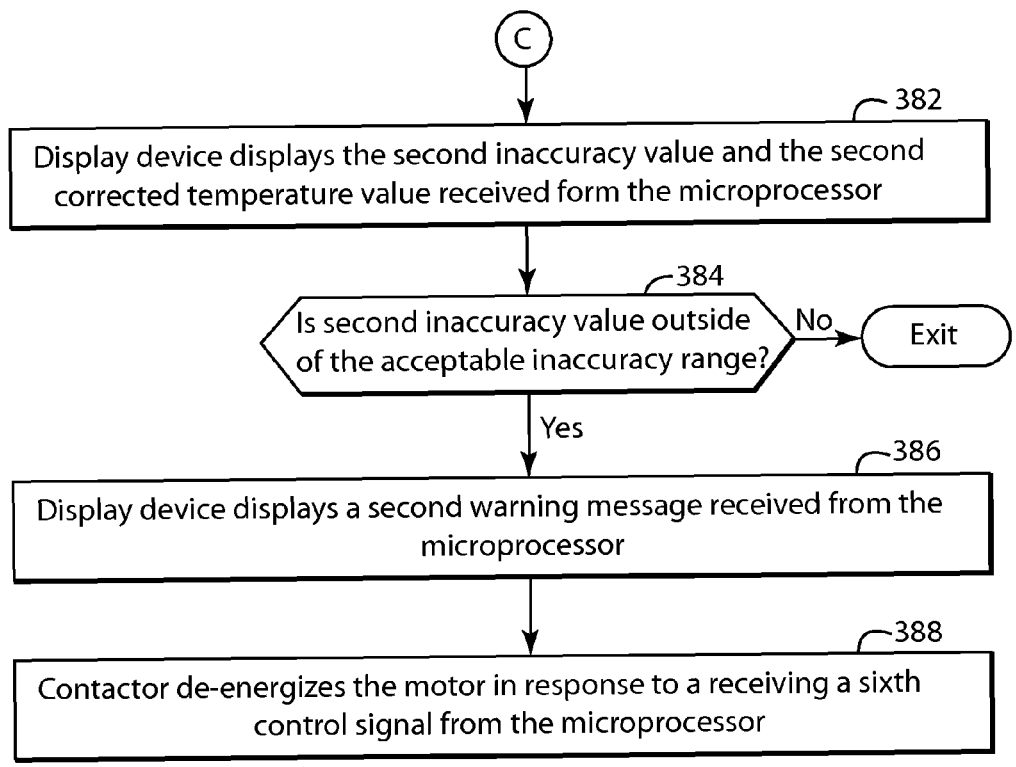

Referring to FIGS. 2 and 3, the microprocessor 190 accesses a lookup table 300 stored in the memory device 200 to determine a predetermined resistance value in order to set a resistance of the controllable variable resistor 102 to simulate a desired simulated thermistor temperature value. As shown, the lookup table 300 has records 310, 312, 314 having associated resistance values and stimulated thermistor temperature values. For example, if the microprocessor 190 determines to utilize a simulated thermistor temperature value of 100 degrees Celsius to test the thermistor amplifier circuit 30, the microprocessor 190 would access the record 310 and retrieve the resistance value of 5,000 Ohms. Thereafter, the microprocessor 190 would send a control signal to the controllable variable resistor 102 to set the resistance of the resistor 102 to 5,000 Ohms.

The transistor 100 is configured to apply a test voltage signal to the thermistor amplifier circuit 30 in response to receiving a control signal from the microprocessor 190. The amplitude of the test voltage signal is indicative of a simulated thermistor temperature value. It should be noted that the resistance of the controllable resistor 102 determines an amplitude of the control signal applied by the transistor 100 to the thermistor amplifier circuit 30 indicative of a simulated thermistor temperature value.

The microprocessor 190 is electrically coupled to the transistor 100, the controllable variable resistor 102, the amplifier 72, the input device 199, the memory device 200, the display device 202, and the contactor 42. The microprocessor 190 is configured to determine an amplitude of an output voltage of the thermistor amplifier circuit 30 and to determine a test temperature value based on the amplitude of the output voltage. In one exemplary embodiment, the microprocessor 190 determines the test temperature value utilizing the following equation: test temperature value=Y×amplitude of output voltage, where Y is an empirically determined value.

The microprocessor 190 is further configured to determine an inaccuracy value based on the test temperature value and the simulated thermistor temperature value. In one exemplary embodiment, the inaccuracy value is a percent inaccuracy value which is determined utilizing the following equation: percent inaccuracy value=((test temperature value−simulated thermistor temperature value)/simulated thermistor temperature value)*100. Also, the microprocessor 190 is further configured to store the inaccuracy value in the memory device 200 and to induce the display device 202 to display the inaccuracy value thereon.

The input device 199 is configured to allow a user to input an acceptable inaccuracy range associated with the inaccuracy value. In one exemplary embodiment, the input device 199 is a keyboard. Of course, in alternative embodiments, the input device 199 could be other types of input devices known to those skilled in the art.

The microprocessor 190 is further configured to induce the display device 202 to display a warning message when an inaccuracy value is outside of the acceptable inaccuracy range. Additionally, the microprocessor 190 is configured to generate a control signal to induce the contactor 42 to de-energize the motor 44 when the inaccuracy value is outside of the acceptable inaccuracy range.

Referring to FIG. 2, a schematic of an exemplary control signal 208 generated by the microprocessor 190 that is received at the input terminal (G) of the transistor 100 is illustrated. The exemplary control signal 208 is generated during a time interval from T1-T2. The control signal 208 induces the transistor 100 to apply a test voltage signal to the thermistor amplifier circuit 30 indicative of a simulated thermistor temperature value.

Also, a schematic of an exemplary output voltage 210 of the thermistor amplifier circuit 30 is illustrated. In this example, the output voltage 210 has a desired amplitude indicating that the thermistor amplifier circuit 30 is operating as desired.

Additionally, a schematic of another exemplary output voltage 220 of the thermistor amplifier circuit 30 is illustrated. In this example, the output voltage 220 has an undesired amplitude indicating that the thermistor amplifier circuit 30 has degraded operation.

Referring to FIGS. 1 and 4-6, flowchart diagrams for a diagnostic method for the thermistor amplifier circuit 30 in accordance with another exemplary embodiment will now be explained.

At step 350, the controllable variable resistor 100 has a first predetermined resistance in response to receiving a first control signal from the microprocessor 190.

At step 352, the transistor 100 applies a first test voltage signal to the thermistor amplifier circuit 30 in response to receiving a second control signal for a first time interval from the microprocessor 190. An amplitude of the first test voltage signal is indicative of a first simulated thermistor temperature value.

At step 354, the thermistor amplifier circuit 30 outputs a first output voltage in response to receiving the first test voltage signal.

At step 356, the microprocessor 190 determines an amplitude of the first output voltage of the thermistor amplifier circuit 30 and determines a first test temperature value based on the amplitude of the first output voltage.

At step 358, the microprocessor 190 determines a first inaccuracy value associated with the first test temperature value based on the first test temperature value and the first simulated thermistor temperature value.

At step 359, the microprocessor 190 determines a first corrected temperature value based on the first temperature value and the first inaccuracy value. In one exemplary embodiment, the first inaccuracy value is a first percent inaccuracy value. If the first percent inaccuracy value is a negative number, the first corrected temperature value is calculated utilizing the following equation: first corrected temperature value=first test temperature value+(first percent inaccuracy value/100*first test temperature value). Alternately, if the first percent inaccuracy value is a positive number, the first corrected temperature value is calculated utilizing the following equation: first corrected temperature value=first test temperature value−(first percent inaccuracy value/100*first test temperature value).

At step 360, the microprocessor 190 stores the first inaccuracy value associated with the first test temperature value, and the first corrected temperature value in the memory device 200.

At step 362, the display device 202 displays the first inaccuracy value and the first corrected temperature value received from the microprocessor 190.

At step 364, the microprocessor 190 makes a determination as to whether the first inaccuracy value is outside of an acceptable inaccuracy range. If the value of step 364 equals "yes", the method advances to step 366. Otherwise, the method advances to step 370.

At step 366, the display device 202 displays a first warning message received from the microprocessor 190. After step 366, the method advances to step 368.

At step 368, the contactor 42 de-energizes the motor 44 in response to a receiving a third control signal from the microprocessor 190. After step 368, the method advances to step 370.

At step 370, the controllable variable resistor 102 has a second predetermined resistance in response to receiving a fourth control signal from the microprocessor 190.

At step 372, the transistor 100 applies a second test voltage signal to the thermistor amplifier circuit 30 in response to receiving a fifth control signal for a second time interval from the microprocessor 190. An amplitude of the second test voltage signal is indicative of a second simulated thermistor temperature value.

At step 374, the thermistor amplifier circuit 30 outputs a second output voltage in response to receiving the second test voltage signal.

At step 376, the microprocessor 190 determines an amplitude of the second output voltage of the thermistor amplifier circuit 30 and determines a second test temperature value based on the amplitude of the second output voltage.

At step 378, the microprocessor 190 determines a second inaccuracy value associated with the second test temperature value based on the second test temperature value and the second simulated thermistor temperature value.

At step 379, the microprocessor 190 determines a second corrected temperature value based on the second temperature value and the second inaccuracy value.

At step 380, the microprocessor 190 stores the second inaccuracy value associated with the second test temperature value, and the second corrected temperature value in the memory device 200.

At step 382, the display device 202 displays the second inaccuracy value and the second corrected temperature value received from the microprocessor 190.

At step 384, the microprocessor 190 makes a determination as to whether the second inaccuracy value is outside of the acceptable inaccuracy range. If the value of step 384 equals "yes", the method advances to step 386. Otherwise, the method is exited.

At step 386, the display device 202 displays a second warning message received from the microprocessor 190. After step 386, the method advances to step 388.

At step 388, the contactor 42 de-energizes the motor 44 in response to a receiving a sixth control signal from the microprocessor 190.

The diagnostic system 40 and the diagnostic method provide a substantial advantage over other systems and methods. In particular, the diagnostic system and diagnostic method provide a technical effect of utilizing a transistor and a controllable variable resistor to apply a test voltage signal to the thermistor amplifier circuit indicative of a first simulated thermistor temperature value.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

We claim:

1. A diagnostic system for a thermistor amplifier circuit, comprising:
    a transistor being electrically coupled in series with a controllable variable resistor, the transistor having an input terminal, a first output terminal, and a second output terminal, the first output terminal being electrically coupled to the thermistor amplifier circuit, the controllable variable resistor being electrically coupled between the second output terminal and electrical ground;
    the controllable variable resistor configured to have a first predetermined resistance in response to receiving a first control signal from a microprocessor;
    the transistor configured to apply a first test voltage signal to the thermistor amplifier circuit in response to receiving a second control signal from the microprocessor, an amplitude of the first test voltage signal being indicative of a first simulated thermistor temperature value;
    the microprocessor configured to determine an amplitude of a first output voltage output by the thermistor amplifier circuit in response to the first test voltage, and to determine a first test temperature value based on the amplitude of the first output voltage; and
    the microprocessor further configured to determine a first inaccuracy value based on the first test temperature value and the first simulated thermistor temperature value.

2. The diagnostic system of claim 1, wherein the transistor is a field-effect transistor, the input terminal is a gate terminal, the first output terminal is a drain terminal, and the second output terminal is a source terminal.

3. The diagnostic system of claim 1, wherein the microprocessor is further configured to store the first inaccuracy value in a memory device.

4. The diagnostic system of claim 1, further comprising an input device configured to allow a user to input an acceptable inaccuracy range.

5. The diagnostic system of claim 4, further comprising a display device operably coupled to the microprocessor, the display device configured to display the first inaccuracy value.

6. The diagnostic system of claim 5, wherein the display device is further configured to display a warning message when the first inaccuracy value is outside of the acceptable inaccuracy range.

7. The diagnostic system of claim 5, further comprising a contactor configured to de-energize a load in response to receiving a third control signal from the microprocessor when the first inaccuracy value is outside of the acceptable inaccuracy range.

8. The diagnostic system of claim 1, wherein the first inaccuracy value is a first percent inaccuracy value, microprocessor further configured to determine the first percent inaccuracy value utilizing the following equation: first percent inaccuracy value=((first test temperature value−first simulated thermistor temperature value)/first simulated thermistor temperature value)*100.

9. The diagnostic system of claim 1, wherein the microprocessor is further configured to determine the first simulated thermistor temperature value by accessing a lookup table.

10. The diagnostic system of claim 1, wherein:
the controllable variable resistor is further configured to have a second predetermined resistance in response to receiving a third control signal from the microprocessor;
the transistor further configured to apply a second test voltage signal to the thermistor amplifier circuit in response to receiving a fourth control signal from the microprocessor, an amplitude of the second test voltage signal being indicative of a second simulated thermistor temperature value;
the microprocessor further configured to determine an amplitude of a second output voltage output by the thermistor amplifier circuit in response to the second test voltage, and to determine a second test temperature value based on the amplitude of the second output voltage; and
the microprocessor further configured to determine a second inaccuracy value based on the second test temperature value and the second simulated thermistor temperature value.

11. The diagnostic system of claim 1, wherein the microprocessor is further configured to determine a first corrected temperature value based on the first temperature value and the first inaccuracy value.

12. A diagnostic method for a thermistor amplifier circuit utilizing a diagnostic system, the diagnostic system having a transistor being electrically coupled in series with a controllable variable resistor, the transistor having an input terminal, a first output terminal, and a second output terminal, the input terminal being electrically coupled to a microprocessor, the first output terminal being electrically coupled to the thermistor amplifier circuit, the controllable variable resistor electrically coupled between the second output terminal and electrical ground, the diagnostic method comprising:
setting a resistance of the controllable variable resistor to a first predetermined resistance in response to the controllable variable resistor receiving a first control signal from the microprocessor;
applying a first test voltage signal to the thermistor amplifier circuit utilizing the transistor in response to the transistor receiving a second control signal from the microprocessor, an amplitude of the first test voltage signal being indicative of a first simulated thermistor temperature value;
outputting a first output voltage by the thermistor amplifier circuit in response to the first test voltage signal;
determining an amplitude of the first output voltage of the thermistor amplifier circuit utilizing the microprocessor;
determining a first test temperature value based on the amplitude of the first output voltage utilizing the microprocessor;
determining a first inaccuracy value based on the first test temperature value and the first simulated thermistor temperature value, utilizing the microprocessor; and
storing the first inaccuracy value in a memory device utilizing the microprocessor.

13. The diagnostic method of claim 12, further comprising inputting an acceptable inaccuracy range utilizing an input device, that is received by the microprocessor.

14. The diagnostic method of claim 13, further comprising displaying the first inaccuracy value on a display device operably coupled to the microprocessor.

15. The diagnostic method of claim 14, further comprising displaying a warning message on the display device when the first inaccuracy value is outside of the acceptable inaccuracy range.

16. The diagnostic method of claim 15, further comprising de-energizing a load when the first inaccuracy value is outside of the acceptable inaccuracy range, utilizing a contactor.

17. The diagnostic method of claim 12, wherein the first inaccuracy value is a first percent inaccuracy value, the first percent inaccuracy value is calculated utilizing the following equation: first percent inaccuracy value=((first test temperature value−first simulated thermistor temperature value)/first simulated thermistor temperature value)*100.

18. The diagnostic method of claim 12, further comprising accessing the first simulated thermistor temperature value in a lookup table.

19. The diagnostic method of claim 12, further comprising:
setting the resistance of the controllable variable resistor to a second predetermined resistance in response to the controllable variable resistor receiving a third control signal from the microprocessor;
applying a second test voltage signal to the thermistor amplifier circuit utilizing the transistor in response to the transistor receiving a fourth control signal from the microprocessor, an amplitude of the second test voltage signal being indicative of a second simulated thermistor temperature value;
outputting a second output voltage by the thermistor amplifier circuit in response to the second test voltage signal;
determining an amplitude of the second output voltage of the thermistor amplifier circuit utilizing the microprocessor;
determining a second test temperature value based on the amplitude of the second output voltage utilizing the microprocessor;
determining a second inaccuracy value based on the second test temperature value and the second simulated thermistor temperature value, utilizing the microprocessor; and
storing the second inaccuracy value in the memory device, utilizing the microprocessor.

20. The diagnostic method of claim 12, further comprising determining a first corrected temperature value based on the first temperature value and the first inaccuracy value.

* * * * *

UNITED STATES PATENT AND TRADEMARK OFFICE
CERTIFICATE OF CORRECTION

PATENT NO. : 8,788,233 B2
APPLICATION NO. : 13/008571
DATED : July 22, 2014
INVENTOR(S) : Vicente et al.

Page 1 of 1

It is certified that error appears in the above-identified patent and that said Letters Patent is hereby corrected as shown below:

In the Claims

In Column 8, Line 51, in Claim 19, delete "signal:" and insert -- signal; --, therefor.

Signed and Sealed this
Nineteenth Day of May, 2015

Michelle K. Lee
*Director of the United States Patent and Trademark Office*